United States Patent

Jun et al.

[11] Patent Number: 5,982,242
[45] Date of Patent: Nov. 9, 1999

[54] CIRCUIT FOR SYNCHRONIZING TRANSMISSION LOCAL OSCILLATING FREQUENCIES IN DIGITAL MICROWAVE SYSTEM

[75] Inventors: Min-Sik Jun; Soo-Bok Kim, both of Seoul, Rep. of Korea

[73] Assignee: SamSung Electronics., Co., Ltd.

[21] Appl. No.: 09/045,655

[22] Filed: Mar. 20, 1998

[30] Foreign Application Priority Data

Mar. 20, 1997 [KR] Rep. of Korea ......................... 97-9471

[51] Int. Cl.⁶ ................................ H03B 5/00; H03L 7/07
[52] U.S. Cl. .................................. 331/49; 331/2; 331/47; 331/55; 375/260; 455/60; 455/67.5; 455/67.7; 455/115; 455/119
[58] Field of Search ............................. 331/2, 18, 47–49, 331/55; 327/292; 375/260; 455/59, 60, 67.5, 67.7, 75, 115, 119, 128

[56] References Cited

U.S. PATENT DOCUMENTS

| | | | |
|---|---|---|---|
| 4,025,874 | 5/1977 | Abbey | 331/55 |
| 4,598,257 | 7/1986 | Southard | 331/2 |
| 4,779,008 | 10/1988 | Kessels | 307/269 |
| 5,059,926 | 10/1991 | Karczewski | 331/47 |
| 5,233,315 | 8/1993 | Verhoeven | 331/45 |
| 5,301,171 | 4/1994 | Blow et al. | 368/46 |
| 5,359,298 | 10/1994 | Abe | 331/2 |
| 5,422,604 | 6/1995 | Jokura | 331/2 |
| 5,592,126 | 1/1997 | Boudewijns et al. | 331/45 |
| 5,610,558 | 3/1997 | Mittel et al. | 331/2 |
| 5,657,359 | 8/1997 | Sakae et al. | 375/376 |
| 5,675,620 | 10/1997 | Chen | 375/376 |
| 5,818,305 | 10/1998 | Jeon | 331/47 |

*Primary Examiner*—David Mis
*Attorney, Agent, or Firm*—Robert E. Bushnell, Esq.

[57] ABSTRACT

A circuit for synchronizing transmission local oscillating frequency in a co-channel microwave system, with more reliability, synchronizes horizontal and vertical polarization waves phase locked dielectric resonators which generate transmission local oscillating frequencies in a digital co-channel microwave system. The circuit includes a first reference signal oscillator for outputting a first reference signal; a second reference signal oscillator for outputting a second reference signal; a first divider for dividing the power of the first reference signal and outputting first and second divided powers; a second divider for dividing the power of the second reference signal and outputting first and second divided powers; a first radio frequency signal generator for detecting the output level of the second divided second reference signal and for outputting one of the first divided first reference signal or the second divided second reference signal as a first radio frequency signal for input to the vertical polarization waves locked dielectric resonator, depending upon the detected result; and a second radio frequency signal generator for detecting the output level of the second divided first reference signal and for outputting one of the first divided second reference signal or the second divided first reference signal as a second radio frequency signal for input to the horizontal polarization waves locked dielectric resonator, depending upon the detected result; the first reference signal oscillator, the first divider, and the first radio frequency signal generator being included in one module and the second reference signal oscillator, the second divider, and the second radio frequency signal generator being included in another module.

21 Claims, 3 Drawing Sheets

CIRCUIT FOR SYNCHRONIZING TRANSMISSION LOCAL OSCILLATING FREQUENCIES IN DIGITAL MICROWAVE SYSTEM

CLAIM OF PRIORITY

This application makes reference to, incorporates the same herein, and claims all benefits accruing under 35 U.S.C. §119 from an application for *CIRCUIT FOR SYNCHRONIZING TRANSMISSION LOCAL OSCILLATING FREQUENCY IN DIGITAL MICROWAVE SYSTEM* earlier filed in the Korean Industrial Property Office on the 20$^{th}$ of Mar. 1997 and there duly assigned Ser. No. 9471/1997.

BACKGROUND OF THE INVENTION

1. Field of the Invention

The present invention relates to a digital microwave system and, more specifically, to a circuit for synchronizing transmission local oscillating frequencies in a digital microwave system.

2. Description of the Related Art

In a recent digital microwave system, co-channels are mostly used to enhance the efficiency, where the frequency of one channel is separated into a vertical polarization wave (hereinafter, referred to as "V") mode and a horizontal polarization wave (hereinafter, referred to as "H") mode and each data is loaded to the V and H modes so as to perform each function.

Upon transmission in a point-to-point microwave system operating with co-channels, a baseband signal is modulated into an intermediate frequency signal by the modulation method adapted in the above system. After that, a frequency converter uses a phase locked dielectric resonator oscillator (hereinafter, referred to as "PLDRO") having good frequency stability and phase noise characteristic at each V and H mode as a local oscillator, increases the frequency of the intermediate frequency signal and outputs it as a radio frequency signal. The V and H signals of the radio frequency outputted as described above are united into one in an OMT (orthomode transducer) after power amplification.

Meantime, a circuit for synchronizing the oscillating frequency of the transmission local oscillator typically includes a reference oscillator, a phase comparator and a loop filter, corresponding to V and H PLDROs. But, the above circuit therefor has its sophisticated construction as well as has the possibility of generating a malfunction in the system of one reference signal oscillator of the V the or H oscillators being out of order.

A technique for solving the above problem has already been proposed in Korean Patent application No. 95-26430, entitled "*Circuit for Synchronizing Local Oscillating Frequency of Transmitter in Co-Channel Digital Microwave System*" and assigned to the same assignee Samsung Electronics, Ltd. as in the present application, on Aug. 24, 1995. The synchronizing circuit as stated hereinbefore, is composed of two modules for co-channel operation and uses a method for controlling bias switches respectively located in the two modules by detecting oscillating signals of reference oscillators included in the modules.

However, it is troublesome for a user to intentionally operate the bias switches for operating the synchronization circuit proposed in the aforesaid patent application with a single channel. Also, each module of the synchronization circuit must have reference signal oscillation controlling ports, and bias switch controlling ports, and these ports are connected to each other through RF cables, thereby resulting in a disadvantage in operating the system. Furthermore, it is impossible to check whether or not the RF cables are properly connected.

The following patents each disclose features in common with the present invention but do not teach or suggest the specifically recited circuit for synchronizing transmission local oscillating frequencies and a digital microwave system as in the present invention: U.S. Pat. No. 5,592,126 to Boudewijns et al., entitled *Multiphase Output Oscillator*, U.S. Pat. No. 4,598,257 to Southard, entitled *Clock Pulse Signal Generator System*, U.S. Pat. No. 4,779,008 to Kessels, entitled *Multiple Redundant Clock System Comprising A Number Of Mutually Synchronizing Clocks, And Clock Circuit For Use In Such A Clock System*, U.S. Pat. No. 5,233,315 to Verhoeven, entitled *Coupled Regenerative Oscillator Circuit*, U.S. Pat. No. 5,301,171 to Blow et al., entitled *Cross-Monitored Pair Of Clocks For Processor Fail-Safe Operation*, U.S. Pat. No. 4,025,874 to Abbey, entitled *Master/Slave Clock Arrangement For Providing Reliable Clock Signal*, U.S. Pat. No. 5,059,926 to Karczewski, entitled *Frequency Synchronization Apparatus*, U.S. Pat. No. 5,422,604 to Jokura, entitled *Local oscillation Frequency synthesizer For Vibration Suppression In The Vicinity Of A Frequency Converging Value*, U.S. Pat. No. 5,675,620 to Chen, entitled *High-Frequency Phase Locked Loop Circuit*, U.S. Pat. No. 5,610,558 to Mittel et al., entitled *Controlled Tracking Of Oscillators In A Circuit With Multiple Frequency Sensitive Elements*, U.S. Pat. No. 5,657,359 to Sakae et al, entitled *Phase Synchronizer And Data Reproducing Apparatus*, and U.S. Pat. No. 5,359,298 to Abe, entitled *VCO Having Voltage-To-Current Converter And PLL Using Same*.

SUMMARY OF THE INVENTION

It is an object of the present invention to provide a circuit for synchronizing transmission local oscillating frequencies in a co-channel microwave system, with more reliability.

It is another object of the present invention to provide a circuit for separating a transmission local oscillating frequency in a co-channel microwave system into H and V modes and synchronizing the local oscillating frequencies of two modes by using one local oscillating frequency of one mode.

It is further another object of the present invention to provide a circuit for reducing the number of RF cables required in synchronizing transmission local oscillating frequencies in a co-channel digital microwave system.

It is still further another object of the present invention to provide a circuit for checking whether or not the RF cables are properly connected, these cables being required in synchronizing transmission local oscillating frequencies in a co-channel digital microwave system.

In order to achieve those and other objects, the present invention is provided with a circuit for synchronizing horizontal and vertical polarization waves phase locked dielectric resonators which generate transmission local oscillating frequencies in a digital microwave system, comprising: a first reference signal oscillator for outputting a first reference signal; a second reference signal oscillator for outputting a second reference signal; a first divider for dividing the power of the first reference signal and for outputting first and second divided powers; a second divider for dividing the power of the second reference signal and for outputting first and second divided powers; a first radio frequency signal generator for detecting the output level of the second divided second reference signal and for outputting one of the first divided first reference signal or the second divided second reference signal as a first radio frequency signal for input to the vertical polarization waves locked dielectric resonator, depending upon the detected output level of the second divided second reference signal; and a second radio frequency signal generator for detecting the output level of the second divided first reference signal and for outputting one of the first divided second reference signal or the second divided first reference signal as a second radio frequency signal for input to the horizontal polarization waves locked dielectric resonator, depending upon the detected output level of the second divided first reference signal; the first reference signal oscillator, the first divider, and the first radio frequency signal generator being included in one module and the second reference signal oscillator, the second divider, and the second radio frequency signal generator being included in other module.

Further, the present invention can achieve those objects with a circuit for synchronizing horizontal and vertical polarization waves phase locked dielectric resonators which generate transmission local oscillating frequencies in a digital microwave system, comprising: a first module, which includes a first division signal input port, a first division signal output port, and a first radio frequency signal output port, for generating a first radio frequency signal for synchronized oscillation of the vertical polarization wave phase locked dielectric resonator; and a second module, which includes a second division signal input port, a second division signal output port, and a second radio frequency signal output port, for generating a second radio frequency signal for synchronized oscillation of the horizontal polarization wave phase locked dielectric resonator; the first module comprising: a first reference signal oscillator for outputting a first reference signal; a first bias switch for selectively switching a first power supply for operating the first reference signal oscillator and for outputting the switched power to the first reference signal oscillator; a first divider for dividing the power of the first reference signal and for outputting first and second divided powers; and a first radio frequency signal generator for detecting the output level of a signal supplied through the first division signal input port, controlling the first bias switch depending upon the detected output level, and outputting one of the first divided first reference signal or the signal supplied through the first division signal input port, as the first radio frequency signal through the first radio frequency signal output port, and the second module comprising: a second reference signal oscillator for outputting a second reference signal; a second bias switch for selectively switching a second power supply for operating the second reference signal oscillator and for outputting the switched power to the second reference signal oscillator; a second divider for dividing the power of the second reference signal and for outputting first and second divided powers; and a second radio frequency signal generator for detecting the output level of a signal supplied through the second division signal input port, controlling the second bias switch depending upon the detected output level, and for outputting one of the first divided second reference signal or the signal supplied through the second division signal input port, as the second radio frequency signal through the second radio frequency signal output port, the second divided first reference signal being supplied to the second division signal input port through the first division signal output port and the second divided second reference signal being supplied to the first division signal output port through the second division signal output port.

Furthermore, the present invention can achieve those objects with a circuit for synchronizing horizontal and vertical polarization waves phase locked dielectric resonators which generate transmission local oscillating frequencies in a digital microwave system, comprising: a first module, which includes a first division signal input port, a first division signal output port, and a first radio frequency signal output port, for generating a first radio frequency signal for synchronized oscillation of the vertical polarization wave phase locked dielectric resonator; and a second module, which includes a second division signal input port, a second division signal output port, and a second radio frequency signal output port, for generating a second radio frequency signal for synchronized oscillation of the horizontal polarization wave phase locked dielectric resonator; the first module comprising: a first reference signal oscillator for outputting a first reference signal; a first bias switch for selectively switching a first power supply for operating of the first reference signal oscillator and for outputting the switched power to the first reference signal oscillator; a first divider for dividing the power of the first reference signal into first and second divided first reference signals and for outputting the second divided first reference signal through the first division signal output port; a first radio frequency signal generator for detecting an output level of a signal supplied through the first division signal input port, controlling the first bias switch depending upon a detected output level, and outputting one of the first divided first reference signal or the signal supplied through the first division signal input port, as the first radio frequency signal through the first radio frequency signal output port; a first DC (direct current) voltage supplying unit connected between the first divider and the first division signal output port, for supplying a given DC voltage to the second divided first reference signal; and a first DC extracting unit connected between the first division signal input port and the first radio frequency signal generator, for extracting a DC voltage supplied to the second divided second reference signal; and the second module comprising: a second reference signal oscillator for outputting a second reference signal; a second bias switch for selectively switching a second power supply for the second reference signal oscillator and for outputting the switched power to the second reference signal oscillator; a second divider for dividing the power of the second reference signal into first and second divided second reference signals and for outputting the second divided second reference signal through the second division signal output port; a second radio frequency signal generator for detecting an output level of a signal supplied through the second division signal input port, controlling the second bias switch depending upon the detected output level, and outputting one of the first divided second reference signal or the signal supplied through the second division signal input port, as the second radio frequency signal through the second radio frequency signal output port; a second DC voltage supplying unit connected between the second divider and the second division signal output port, for supplying a given DC voltage to the second divided second reference signal; and a second DC extracting unit connected between the second division signal input port and the second radio frequency signal generator, for extracting a DC voltage supplied to the second divided first reference signal; the second divided first reference signal being supplied to the second division signal input port through a first radio frequency cable connected between the first division signal output port and the second division signal input port, and the second divided second reference signal being supplied to the first division signal output port through a second radio frequency cable connected between the second division signal output port and the first division signal input port.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT(S)

Figure 1:
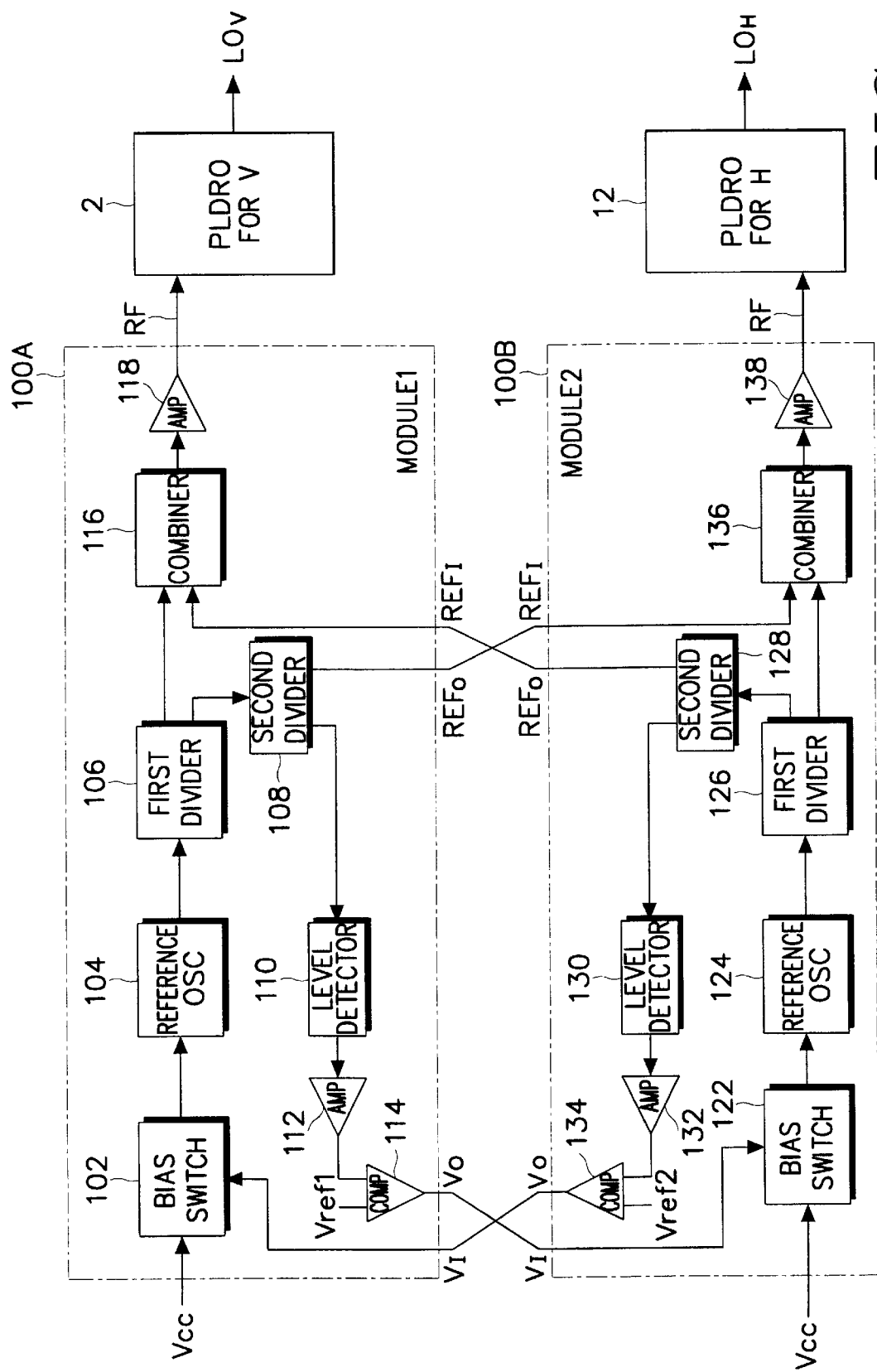
FIG. 1 shows the construction of a circuit for synchronizing transmission local oscillating frequencies in an earlier digital microwave system.

Hereinafter, a preferred embodiment of the present invention will be concretely explained with reference with accompanying drawings.

Most of all, throughout the drawings, it is noted that the same reference numerals or letters will be used to designate like or equivalent elements having the same function. Further, in the following description, numerous specific details such as concrete components composing the circuits and their frequencies, are set forth to provide a more thorough understanding of the present invention. It will be apparent, however, to one skilled in the art that the present invention may be practiced without these specific details. A detailed description of known functions and constructions unnecessarily obscuring the subject matter of the present invention have been omitted in the following description. Furthermore, wordings as will be explain hereinafter can be different depending upon the intention or the practice of a chip designer or a user as to what has been defined in consideration of the function of the present invention and, definitions for the above wordings will be made on the basis of the content throughout the specification.

FIG. 1 shows the construction of a circuit for synchronizing transmission local oscillating frequencies in an earlier digital microwave system.

The synchronizing circuit is composed of two modules 100A and 100B for co-channel operation and controls bias switches 102 and 122 located respectively in the modules 100A and 100B by detecting oscillating signals of reference oscillators 104 and 124.

The output of the reference oscillator 104 is connected to a first divider 106 which divides the signal into two parts, a first part being fed to a combiner 116 and a second part being fed to a second divider 108.

The output of the second divider is connected to a level detector whose output in turn is connected to an amplifier whose output is compared in a comparator 114 with a first reference voltage $B_{REF1}$.

The output of the combiner 116 is amplified by an amplifier 118 whose output is the RF output of module 100A.

Similarly, the first divider 126, second divider 128, combiner 136, level detector 130, amplifier 132, comparator 134, and amplifier 138 of module 100B operate in a similar fashion.

The RF outputs of modules 100A and 100B are respectively fed to the vertical and horizontal phase locked dielectric resonator oscillators 2 and 12.

Figure 2:
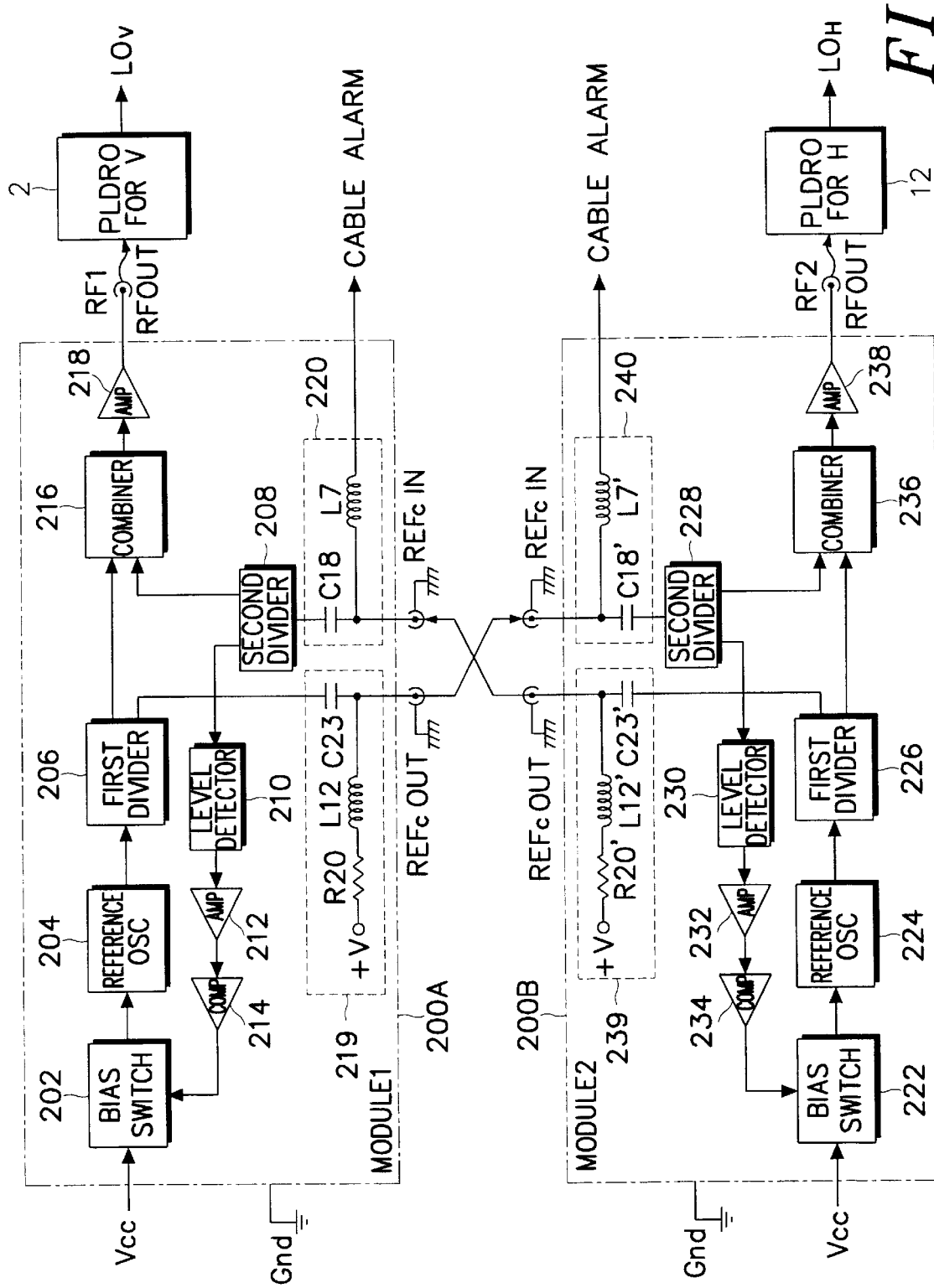
FIG. 2 shows the construction of a circuit for synchronizing transmission local oscillating frequencies in a digital microwave system according to the present invention.

FIG. 2 shows the construction of a circuit for synchronizing transmission local oscillating frequencies in a digital microwave system according to the present invention, where the circuit comprises two modules 200A and 200B for synchronizing V local oscillating frequency and H local oscillating frequency as outputs of a V PLDRO 2 and a H PLDRO 12, which is similar to the circuit shown in FIG. 1. The first module 200A according to the present invention is a V mode transmission local oscillating frequency synchronization circuit for providing a first radio frequency signal to perform synchronized oscillating operation of the V PLDRO 2 and the second module 200B according to the present invention is a H mode transmission local oscillating frequency synchronization circuit for providing a second radio frequency signal to perform synchronized oscillating operation of the H PLDRO 12. In this case, the first module 200A and the second module 200B are comprised of components performing the same function.

With reference to FIG. 2, the synchronization circuit according to the present invention is made to apply a radio frequency reference signal generated in one module to the V and H PLDROs 2 and 12 at the same time, similar to the synchronization circuit shown in FIG. 1. For example, when a reference signal is outputted with operating a reference signal oscillator (OSC) 204 of the first module 200A, the reference signal is applied with the same power value to a combiner 216 of the first module 200A and a combiner 236 of the second module 200B, thereby resulting in applying the reference signal to V and H PLDROs 2 and 12, at the same time. Therefore, although the reference signal oscillator of one module may be out of order, the reference signal oscillator of the other module operates to provide the reference signal. As a result, the V and H PLDROs 2 and 12 normally oscillate at the transmission local oscillating frequency.

In the meanwhile, as the characteristic fact of the synchronization circuit according to the present invention unlike the foregoing, the first module 200A and the second module 200B include respectively a division signal input port REF$_c$IN, a division signal output port REF$_c$OUT, and a radio frequency signal output port RFOUT and each module are connected with one another via only two cables. That is, the division signal input port REF$_c$IN of the first module 200A and the division signal output port REF$_c$OUT of the second module 200B are coupled to each other through one cable, and the division signal output port REF$_c$OUT of the first module 200A and the division signal input port REF$_c$IN of the second module 200B are coupled to each other through the other cable. As stated before, even in the case of connecting the first module 200A and the second module 200B to each other with only two cables, the synchronization circuit in accordance with the present invention enables two PLDROs 2 and 12 to operate with the reference signal occurring in one module. This oscillating operation is performed because each module of the synchronization circuit detects a signal inputted through the RF cable after oscillation by the reference signal oscillator of the other module and controls the bias switch of the module with the above detected result.

The bias switch 202 for controlling the supplying of the power supply Vcc to cause the reference signal oscillator 204 of the first module 200A to oscillate has a level detector 210, an amplifier (AMP) 212, and a comparator (COMP) 214, and is switching-controlled with the results detected by the above components. The level detector 210 detects whether or not a signal output by the reference signal oscillator 224 of the second module 200B is inputted through the division signal input port REF$_c$IN and divided by a second divider 208. Here, when there is no input of the signal through the division signal input port REF$_c$IN, namely, when the reference signal oscillator 224 of the second module 200B is not oscillating, the comparator 214 switches on the bias switch 202 and controls to supply the power supply Vcc for the oscillating the reference signal oscillator 204. Unlike that, when there is the input of the signal through the division signal input port REF$_c$IN, namely, when the reference signal oscillator 224 of the second module 200B is oscillating, the comparator 214 switches off the bias switch 202 so as not to supply the power supply Vcc for causing the reference signal oscillator 204 to oscillate.

The bias switch 222 for controlling the supplying of the power supply Vcc to cause the reference signal oscillator 224 of the second module 200B to oscillate has a level detector 230, an amplifier (AMP) 232, and a comparator (COMP) 234, and is switching-controlled with the results detected by the above components. The level detector 230 detects whether or not a signal outputted the reference signal oscillator 204 of the first module 200A is inputted through the division signal input port REF$_c$IN and divided by a second divider 228. Here, when there is no input of the signal through the division signal input port REF$_c$IN, namely, when the reference signal oscillator 204 of the first module 200A is not oscillating, the comparator 234 switches on the bias switch 222 and controls to supply the power supply Vcc for oscillating the reference signal oscillator 224. Unlike that, when there is the input of the signal through the division signal input port REF$_c$IN, namely, when the reference signal oscillator 204 of the first module 200A is oscillating, the comparator 234 switches off the bias switch 222 so as not to supply the power supply Vcc for causing the reference signal oscillator 224 to oscillate. The outputs of the second dividers 226 and 228 are connected to the combiner 236 connected to the amplifier 238.

The synchronization circuit in conformity with the present invention adapts a method such that each module of the synchronization circuit detects a signal inputted through the RF cable after oscillation by the reference signal oscillator of the other module and controls the bias switch of the module with the above detected result. In this instance, it is noted that the number of the RF cables connecting each module of the synchronization circuit according to the present invention is reduced by 2 as compared to the earlier synchronization circuit.

Further, as the characteristic fact of the synchronization circuit according to the present invention, existence/nonexistence of the abnormal state of the RF cable for connecting each module can be checked. At this moment, the checked result can be represented by cable alarm and the existence/nonexistence of the abnormal state of the RF cable can be checked from the driving state of a light emitting diode (LED) for checking whether or not a reference signal oscillator in the module is being driven. The detection of the existence/nonexistence of the abnormal state of the RF cable is executed by direct current (DC) supplying units 219 and 239, and DC voltage extracting units 220 and 240 installed at a front terminal of the division signal output port REF$_c$OUT and at a front terminal of the division signal input port REF$_c$IN of each module. The DC voltage supplying units 219 and 239 supply the given DC voltage V to a signal divided by first dividers 206 and 226 and the DC voltage extracting units 220 and 240 extract the DC voltage applied by the DC voltage supplying units 219 and 239 supplied through the RF cable. Consequently, the DC voltage extracting units 220 and 240 can detect whether or not the RF cable is. Also, the detected results can be represented by an external cable alarm.

The DC voltage supplying units 219 and 239 are respectively comprised of resistors R20 and R20', inductors L12 and L12', and capacitors C23 and C23'.

The DC voltage extracting units 220 and 240 are respectively comprised of capacitors C18 and C18' and inductors L7 and L7'.

Figure 3:
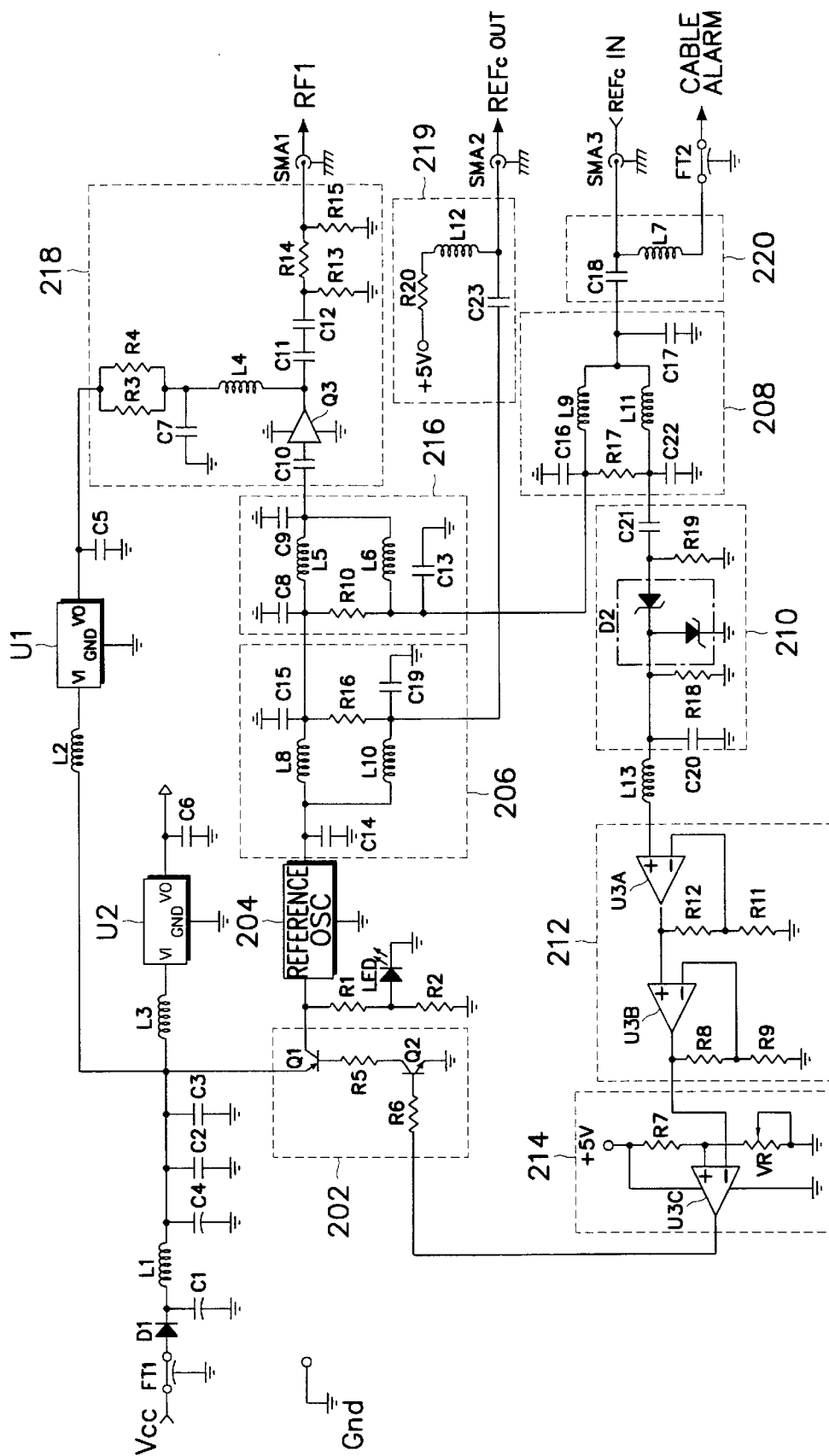
FIG. 3 is a detailed circuit diagram showing a circuit for synchronizing transmission local oscillating frequencies as illustrated in FIG. 2.

FIG. 3 is a detailed circuit diagram showing a circuit for synchronizing two transmission local oscillating frequencies as illustrated in FIG. 2, which more specifically, shows in detail a circuit of the first module 200A. It is noted that the construction of FIG. 3 is adapted to the second module 200B except for the reference numerals.

In FIGS. 2 and 3, reference numerals 202 and 222 are bias switches for switching on/off the power supply voltage Vcc supplied to the reference signal oscillators (OSCs) 204 and 224 and include transistors Q1 and Q2, and resistors R5 and R6. The bias switches 202 and 222 switch the power supply voltage Vcc supplied to the reference signal oscillators 224 and 204 of the opposite modules depending upon whether or not the reference signal oscillators 204 and 224 operate normally.

If the bias switch 202 of the first module 1 200A is switched on, the reference signal oscillator 204 operates normally, and a signal output by the reference signal oscillator 204 is outputted as a first radio frequency reference signal RF1 for the V PLDRO 2 by passing through the first divider 206, the combiner 216, and the amplifier 218. Then, after being divided by second divider 228 through the division signal output port REF$_c$OUT of the first module 200A and the division signal input port REF$_c$IN of the second module 200B, the signal divided by the first divider 206 is supplied to the level detector 230 and the combiner 236. The level detector 230 detects the level of the signal divided by the second divider 228, and the amplifier 232 amplifies the detected result of the level detector 230 and outputs the amplified result. Then, the comparator 234 receives the output of the amplifier 232, compares the inputted output with the given reference voltage, and outputs the compared result. At this time, the comparator 234 outputs the compared result of "low" level in response to the input of the oscillating signal of the reference signal oscillator 204. Accordingly, the bias switch 222 is switched off in response to the compared result of a "low" level, the reference signal oscillator 224 does not output the reference signal, and the reference signal output by the second reference signal oscillator 224 is not supplied to the combiner 236. However, at that time, since the signal divided by the second divider 228, that is, the reference signal output by the reference signal oscillator 204 is supplied to the combiner 236, the reference signal is supplied as the second radio frequency signal RF2 for the H PLDRO 12 through the amplifier 238.

Reference numeral 204 is an oscillator for outputting the reference signal, generates the reference signal RF used for synchronizing the local oscillating frequency of the V and H PLDROs 2 and 12 in response to application of the power supply voltage Vcc through the bias switch 202. Reference number 206 is a first divider which divides the power of the reference signal RF outputted from reference signal oscillators 204 and 224 into the combiner 216 and the second divider 228 of the second module 200B. The first divider 206 is an unbalanced type wilkinson divider, and divides the power of the signal supplied to the combiner 216 and the power of the signal supplied to the second divider 228 with a ratio of 2 to 3. Reference numeral 208 is the second divider, embodied also as the unbalanced type Wilkinson divider, and divides the power of the signal outputted from the first divider 206 of the second module 200B, into the level detector 210 and the combiner 216. At this point, the ratio of the power of the signal divided into the level detector 210 and the signal divided into the combiner 216 is 2:3. Therefore, the power of the signal supplied to the combiner 216 being divided by the first divider 206 is equal to the power of the signal supplied to the combiner 236 of the second module 200B after being divided by the first divider 206 and the second divider 228 of the second module 200B. Reference numeral 216 is a Wilkinson combiner. The combiner 216 has the input isolation feature for the signal of the first divider 206 or the second divider 208. Following amplification to the proper level in the amplifier 218, the output of the combiner 216 is supplied as the first radio frequency reference signal RF1 to the V PLDRO 2.

Reference numeral 210 is a level detector comprised of a schottky diode D2. The level detector 210 converts the signal outputted from the second divider 208 into a DC voltage and outputs the converted voltage to a DC voltage amplifier 212. Reference number 212 is a DC voltage amplifier comprised of two OP amplifiers U3A and U3B. The DC voltage amplifier 212 amplifies the DC voltage outputted from the level detector 210 by the proper level and, outputs the amplified voltage to the comparator 214. Reference numeral 214 is the comparator having an OP amplifier U3C. The comparator 214 compares the signal amplified in the DC voltage amplifier 212 with the voltage input a non-inverting terminal (+) and outputs a "high" level or "low" level. When the output voltage of the DC voltage amplifier 212 is more than the voltage at the non-inverting terminal (+), the comparator 214 outputs a "low" level. To the contrary, when the output voltage of the DC voltage amplifier 212 is less than the voltage at the non-inverting terminal (+), the comparator 214 outputs a "high" level. The signal of a "low" level outputted as discussed above switches off the bias switch 202 and the signal of a "high" level switches on the bias switch 202. The voltage at the non-inverting terminal (+) apparent from the foregoing is the voltage ({VR/VR+R7}×5V) according to the ratio of the resistor R7 serial-connected to the variable resistor VR.

Reference numeral 219 is a DC voltage supplying unit comprised of a capacitor C23 connected between the first divider 206 and the division signal output port REF$_c$OUT, a serial-connected resistor R20 connected to the capacitor C23, and an inductor L12. Since the serial voltage is supplied through the resistor R20, the signal including the DC voltage of 5V and the signal divided by the first divider 206 are outputted by the division signal output port REF$_c$OUT. Reference numeral 220 is a DC voltage extracting unit comprised of a capacitor C18 connected between the division signal input port REF$_c$IN and the second divider 208, and an inductor L7 whereof one terminal is connected to the division signal input port REF$_c$IN. The DC voltage extracting unit 220 extracts the DC voltage component included within the signal supplied through the division signal input port REF$_c$IN and outputs the cable alarm CABLE ALARM indicating the extracted result. The extraction of the DC voltage means that the RF cable is normal when the reference signal oscillator operates normally, and the non-extraction of the DC voltage means that RF cable is not normal.

Diode D1, capacitors C1–C7, inductors L1–L4 and voltage regulators U1 and U2 form the regulated power supply voltages for the elements of FIG. 3.

Resistors R1 and R2, together with the light emitting diode LED provide a visual indication as to the state of the bias switch 202.

Capacitors C14, C15 and C19, inductors L8 and L10 and resistors R16 form the fist divider 206.

Similarly, capacitors C16, C17, and C22, inductors L9 and L11 and resistors R17 form the second divider 208.

Capacitors C20 and C21 as well as resistors R18 and R19 are part of the level detector 210 whose output is fed to the amplifier 212 via the inductor L13.

Resistors R8, R9, R11, and R12 are included in the amplifier 212.

The combiner 216 is comprised of capacitor C8, C9, and C13, inductors L5 and L6 and resistor R10.

The amplifier 218 consists of resistors R3, R4, R13, R14, and R15, capacitors C10, C11, and C12, and amplifier Q3.

Feed through capacitors FT1 and FT2 are provided for isolation purposes.

As may be apparent from the aforementioned description, the present invention can process the output signal of one reference oscillator of the horizontal polarization wave mode or the vertical polarization wave mode and synchronize the V and H phase locked dielectric resonator at the same time, thereby having an advantage in that other oscillator can be automatically switched upon the reference signal oscillator under operation being out of order. Since the modules of the present invention performing the above operation are connected to each other using only two cables, the present invention can be very applicable on the condition that only two external cables can be removed in the case of using the synchronization circuit with a single channel. Likewise, in the case of using the synchronization circuit with a co-channel, the connection state of the cables is detected by the alarm signal as well as the driving state of the reference signal oscillator is detected advantageously.

While there has been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiments disclosed as the best modes contemplated for carrying out the present invention, but that the present invention includes all embodiments falling within the scope of the appended claims.

What is claimed is:

1. A circuit for synchronizing horizontal and vertical polarization waves phase locked dielectric resonators which generate transmission local oscillating frequencies in a digital microwave system, comprising:

a first reference signal oscillator for outputting a first reference signal;

a second reference signal oscillator for outputting a second reference signal;

a first divider for dividing the power of said first reference signal and for outputting first and second divided powers;

a second divider for dividing the power of said second reference signal and for outputting first and second divided powers;

a first radio frequency signal generator for detecting the output level of said second divided second reference signal and for outputting one of said first divided first reference signal or said second divided second reference signal as a first radio frequency signal for input to said vertical polarization waves locked dielectric resonator, depending upon the detected output level of said second divided second reference signal; and a second radio frequency signal generator for detecting the output level of said second divided first reference signal and for outputting one of said first divided second reference signal or said second divided first reference signal as a second radio frequency signal for input to said horizontal polarization waves locked dielectric resonator, depending upon the detected output level of said second divided first reference signal;

said first reference signal oscillator, said first divider, and said first radio frequency signal generator being included in one module and said second reference signal oscillator, said second divider, and said second radio frequency signal generator being included in another module.

2. The circuit as recited in claim 1, said first radio frequency signal generator comprising:

a level detector for detecting the output level of said second divided second reference signal;

a comparator for comparing the output level detected by said level detector with a predetermined reference voltage and for outputting a comparison result as a signal for selectively controlling said first reference signal oscillator; and a combiner for combining said first divided first reference signal with said second divided second reference signal and for outputting a combined result as said first radio frequency signal.

3. The circuit as recited in claim 2, further comprising:

a divider for power-dividing said second divided second reference signal into said level detector and said combiner.

4. The circuit as recited in claim 1, said second radio frequency signal generator comprising:

a level detector for detecting the output level of said second divided first reference signal;

a comparator for comparing the output level detected by said level detector with a predetermined reference voltage and for outputting a comparison result as a signal for selectively controlling said second reference signal oscillator; and a combiner for combining said first divided second reference signal with said second divided first reference signal and for outputting a combined result as said second radio frequency signal.

5. The circuit as recited in claim 4, further comprising:

a divider for power-dividing said second divided first reference signal into said level detector and said combiner.

6. A circuit for synchronizing horizontal and vertical polarization waves phase locked dielectric resonators which generate transmission local oscillating frequencies in a digital microwave system, comprising:

a first module, which includes a first division signal input port, a first division signal output port, and a first radio frequency signal output port, for generating a first radio frequency signal for synchronized oscillation of said vertical polarization wave phase locked dielectric resonator; and a second module, which includes a second division signal input port, a second division signal output port, and a second radio frequency signal output port, for generating a second radio frequency signal for synchronized oscillation of said horizontal polarization wave phase locked dielectric resonator;

said first module comprising:

a first reference signal oscillator for outputting a first reference signal;

a first bias switch for selectively switching a first power supply for operating said first reference signal oscillator and for outputting the switched power to said first reference signal oscillator;

a first divider for dividing the power of said first reference signal and for outputting first and second divided powers; and a first radio frequency signal generator for detecting the output level of a signal supplied through said first division signal input port, controlling said first bias switch depending upon the detected output level, and outputting one of said first divided first reference signal or the signal supplied through said first division signal input port, as said first radio frequency signal through said first radio frequency signal output port;

and said second module comprising:

a second reference signal oscillator for outputting a second reference signal;

a second bias switch for selectively switching a second power supply for operating said second reference signal oscillator under and for outputting the switched power to said second reference signal oscillator;

a second divider for dividing the power of said second reference signal and for outputting the first and second divided powers; and a second radio frequency signal generator for detecting the output level of a signal supplied through said second division signal input port, controlling said second bias switch depending upon the detected output level, and outputting one of said first divided second reference signal or the signal supplied through said second division signal input port, as said second radio frequency signal through said second radio frequency signal output port;

said second divided first reference signal being supplied to said second division signal input port through said first division signal output port and said second divided second reference signal being supplied to said first division signal output port through said second division signal output port.

7. The circuit as recited in claim 6, said first radio frequency signal generator comprising:

a level detector for detecting the output level of said second divided second reference signal inputted through said first division signal input port;

a comparator for comparing the output level detected by said level detector with a predetermined reference voltage and for outputting a comparison result as a signal for selectively controlling switching of said first bias switch; and a combiner for combining said first divided first reference signal with said second divided second reference signal inputted through said first division signal input port and for outputting a combined result as said first radio frequency signal through said first division signal output port.

8. The circuit as recited in claim 7, further comprising:
a divider for power-dividing said second divided second reference signal, inputted through said first division signal input port, into said level detector and said combiner.

9. The circuit as recited in claim 6, said second radio frequency signal generator comprising:
a level detector for detecting the output level of said second divided first reference signal inputted through said second division signal input port;
a comparator for comparing the output level detected by said level detector with a predetermined reference voltage and for outputting the a comparison result as a signal for selectively controlling switching said second bias switch; and
a combiner for combining said first divided second reference signal with said second divided first reference signal inputted through said second division signal input port and outputting a combined result as said second radio frequency signal through said second radio frequency signal output port.

10. The circuit as recited in claim 9, further comprising:
a divider for power-dividing said second divided first reference signal, inputted through said second division signal input port, into said level detector and said combiner.

11. A circuit for synchronizing horizontal and vertical polarization waves phase locked dielectric resonators which generate transmission local oscillating frequencies in a digital microwave system, comprising:
a first module, which includes a first division signal input port, a first division signal output port, and a first radio frequency signal output port, for generating a first radio frequency signal for synchronized oscillation of said vertical polarization wave phase locked dielectric resonator; and
a second module, which includes a second division signal input port, a second division signal output port, and a second radio frequency signal output port, for generating a second radio frequency signal for synchronized oscillation of said horizontal polarization wave phase locked dielectric resonator;
said first module comprising:
a first reference signal oscillator for outputting a first reference signal;
a first bias switch for selectively switching a first power supply for operating said first reference signal oscillator and for outputting the switched power to said first reference signal oscillator;
a first divider for dividing the power of said first reference signal into first and second divided first reference signals and for outputting the second divided first reference signal through said first division signal output port;
a first radio frequency signal generator for detecting an output level of a signal supplied through said first division signal input port, controlling said first bias switch depending upon a detected output level, and outputting one of said first divided first reference signal or the signal supplied through said first division signal input port, as said first radio frequency signal through said first radio frequency signal output port;
a first DC (direct current) voltage supplying unit connected between said first divider and said first division signal output port, for supplying a given DC voltage to said second divided first reference signal; and
a first DC extracting unit connected between said first division signal input port and said first radio frequency signal generator, for extracting a DC voltage supplied to said second divided second reference signal;
and said second module comprising:
a second reference signal oscillator for outputting a second reference signal;
a second bias switch for selectively switching a second power supply for operating said second reference signal oscillator and for outputting the switched power to said second reference signal oscillator;
a second divider for dividing the power of said second reference signal into first and second divided second reference signals and for outputting the second divided second reference signal through said second division signal output port;
a second radio frequency signal generator for detecting an output level of a signal supplied through said second division signal input port, controlling said second bias switch depending upon the detected output level, and outputting one of said first divided second reference signal or the signal supplied through said second division signal input port, as said second radio frequency signal through said second radio frequency signal output port;
a second DC voltage supplying unit connected between said second divider and said second division signal output port, for supplying a given DC voltage to said second divided second reference signal; and
a second DC extracting unit connected between said second division signal input port and said second radio frequency signal generator, for extracting a DC voltage supplied to said second divided first reference signal;
said second divided first reference signal being supplied to said second division signal input port through a first radio frequency cable connected between said first division signal output port and said second division signal input port, and said second divided second reference signal is supplied to said first division signal output port through a second radio frequency cable connected between said second division signal output port and said first division signal input port.

12. The circuit as recited in claim 11, said first radio frequency signal generator comprising:
a level detector for detecting the output level of said second divided second reference signal inputted through said first division signal input port;
a comparator for comparing the output level detected by said level detector with a predetermined reference voltage and for outputting a comparison result as a signal for selectively controlling switching of said first bias switch; and
a combiner for combining said first divided first reference signal with said second divided second reference signal inputted through said first division signal input port and for outputting a combined result as said first radio frequency signal through said first division signal output port.

13. The circuit as recited in claim 12, further comprising:
a divider for power-dividing said second divided second reference signal inputted through said first division signal input port, into said level detector and said combiner.

14. The circuit as recited in claim 11, said first DC voltage extracting unit extracting the DC voltage supplied to said second divided second reference signal supplied to said first division signal input port and detecting whether or not said first radio frequency cable operates normally in accordance with the extracted DC voltage.

15. The circuit as recited in claim 12, said first DC voltage extracting unit extracting the DC voltage supplied to said second divided second reference signal supplied to said first division signal input port and detecting whether or not said first radio frequency cable operates normally in accordance with the extracted DC voltage.

16. The circuit as recited in claim 13, said first DC voltage extracting unit extracting the DC voltage supplied to said second divided second reference signal supplied to said first division signal input port and detecting whether or not said first radio frequency cable operates normally in accordance with the extracted DC voltage.

17. The circuit as recited in claim 11, said second radio frequency signal generator comprising:

- a level detector for detecting the output level of said second divided first reference signal input ted through said second division signal input port;
- a comparator for comparing the output level detected by said level detector with a predetermined reference voltage and for outputting a comparison result as a signal for selectively controlling switching of said second bias switch; and
- a combiner for combining said first divided second reference signal with said second divided first reference signal inputted through said second division signal input port and for outputting a combined result as said second radio frequency signal through said second radio frequency signal output port.

18. The circuit as recited in claim 17, further comprising:

- a divider for power-dividing said second divided first reference signal, inputted through said second division signal input port, into said level detector and said combiner.

19. The circuit as recited in claim 11, said second DC voltage extracting unit extracting the DC voltage supplied to said second divided first reference signal supplied to said second division signal input port and detecting whether or not said second radio frequency cable operates normally in accordance with the extracted DC voltage.

20. The circuit as recited in claim 17, said second DC voltage extracting unit extracting the DC voltage supplied to said second divided first reference signal supplied to said second division signal input port and detecting whether or not said second radio frequency cable operates normally in accordance with the extracted DC voltage.

21. The circuit as recited in claim 18, said second DC voltage extracting unit extracting the DC voltage supplied to said second divided first reference signal supplied to said second division signal input port and detecting whether or not said second radio frequency cable operates normally in accordance with the extracted DC voltage.

* * * * *